(12) United States Patent
Nero, Jr.

(10) Patent No.: US 8,896,291 B2
(45) Date of Patent: Nov. 25, 2014

(54) POWER LINE TAKEOFF CLAMP ASSEMBLY

(71) Applicant: Tollgrade Communications, Inc., Cranberry Township, PA (US)

(72) Inventor: Regis J. Nero, Jr., Export, PA (US)

(73) Assignee: Tollgrade Communications, Inc., Cranberry Twp., PA (US)

( * ) Notice: Subject to any disclaimer, the term of this patent is extended or adjusted under 35 U.S.C. 154(b) by 0 days.

(21) Appl. No.: 13/964,201

(22) Filed: Aug. 12, 2013

(65) Prior Publication Data
US 2013/0328546 A1    Dec. 12, 2013

Related U.S. Application Data

(62) Division of application No. 12/503,417, filed on Jul. 15, 2009, now Pat. No. 8,536,857.

(60) Provisional application No. 61/081,881, filed on Jul. 18, 2008.

(51) Int. Cl.
| | |
|---|---|
| *G01R 19/22* | (2006.01) |
| *G01R 15/18* | (2006.01) |
| *G01R 15/14* | (2006.01) |
| *G01R 1/22* | (2006.01) |

(52) U.S. Cl.
CPC .............. *G01R 15/18* (2013.01); *G01R 15/142* (2013.01); *G01R 1/22* (2013.01); *G01R 15/186* (2013.01)

USPC .......................................................... 324/119

(58) Field of Classification Search
USPC ................. 324/119, 117 H, 117 R, 126, 127; 340/660–664
See application file for complete search history.

(56) References Cited

U.S. PATENT DOCUMENTS

| | | | | |
|---|---|---|---|---|
| 4,728,887 | A | 3/1988 | Davis | |
| 4,801,937 | A | 1/1989 | Fernandes | |
| 4,808,917 | A | 2/1989 | Fernandes | |
| 5,426,360 | A * | 6/1995 | Maraio et al. .................. | 324/126 |
| 7,135,850 | B2 * | 11/2006 | Ramirez ........................ | 324/142 |

* cited by examiner

*Primary Examiner* — Tung X Nguyen
(74) *Attorney, Agent, or Firm* — The Webb Law Firm

(57) ABSTRACT

In a power line takeoff clamp assembly and method of use thereof an electrical power distribution line is clamped to a body of the clamp assembly. A power takeoff supported by the body clamped to the power line generates direct current from alternating current flowing in the power line. One or more sensors supported by the body clamped to the power line sense one or more values related to an electrical current flowing in a power line. A wireless transceiver supported by the body clamped to the power line communicates data regarding the one or more sensed values. Each sensor and the wireless transceiver utilize direct current generated by the power takeoff for the operation thereof.

7 Claims, 17 Drawing Sheets

FULLY OPEN RIGHT SIDE CROSS-SECTION

PARTIALLY OPEN RIGHT SIDE CROSS-SECTION

FULLY CLOSED RIGHT SIDE CROSS-SECTION

FULLY OPEN CENTER CROSS-SECTION

PARTIALLY OPEN CENTER CROSS-SECTION

HOUSING CLOSED CENTER CROSS-SECTION

CLAMP CLOSED CENTER CROSS-SECTION

FULLY OPEN LEFT SIDE CROSS-SECTION

PARTIALLY OPEN LEFT SIDE CROSS-SECTION

FULLY CLOSED LEFT SIDE CROSS-SECTION

POWER LINE TAKEOFF CLAMP ASSEMBLY

CROSS REFERENCE TO RELATED APPLICATIONS

This application is a divisional of U.S. patent application Ser. No. 12/503,417, filed Jul. 15, 2009, Now U.S. Pat. No. 8,536,857 which claims priority to U.S. Provisional Patent Application No. 61/081,881, filed Jul. 18, 2008, the disclosures of which are incorporated herein by reference.

BACKGROUND OF THE INVENTION

1. Field of the Invention

The present invention relates to a power line takeoff clamp assembly configured to be clamped about an electrical power distribution line. The clamp assembly houses a power takeoff (PTO) and a power line sense and communication module which derives its power from the PTO for sensing current flow in the electrical power distribution line and for radio transmitting data regarding the current flowing in the electrical power distribution line and/or a temperature of the electrical power distribution line.

2. Description of Related Art

The electric distribution grid in North America is characterized by aging infrastructure and outdated technology at a time when digital society demands an increased quantity and more reliable electrical power. As the investment cycle within the electricity distribution industry reaches a critical juncture for reinvestment in and optimization of the existing infrastructure, there is enormous pent-up demand to apply computer and electronics technologies in an industrial sector that has lagged the advancements made in the telecommunications, medical, aerospace, and manufacturing industries.

Very little automation or monitoring typically exists between the customer meter and an electrical substation, making it difficult to quickly identify the cause and location of an electrical distribution problem, e.g., an outage, without manual dispatch of field crews. Additionally, planning and maintenance engineers in the electric utilities typically have limited information about the behavior of a circuit to drive the best decisions for circuit upgrade/rehabilitation tasks, and determining upgrade or replacement of equipment.

An electric utility may have Supervisory Control and Data Acquisition (SCADA) capability allowing it to have centralized remote monitoring of circuit load immediately exiting a substation and perhaps a midpoint circuit reading. However, very few electric utilities have widely deployed SCADA systems, and those that do are only provided with circuit level information (entire circuit faulted and open) and cannot discern a fault location along the many miles a circuit typically spans. The utility depends on notification to their call center from customers to determine the location of damaged equipment during a power outage. Additionally, they will usually call customers to confirm restoration of power.

Electrical distribution circuits are prone to temporary faults such as nearby lightning strikes, wind-borne debris, small animals climbing insulators, and the like. With a conventional circuit breaker or fuse, a transient fault opens the breaker or blows the fuse, de-energizing the line until a technician manually recloses the circuit breaker or replaces the blown fuse. Automatic reclosing devices (autoreclosers) often make several pre-programmed attempts to re-energize the line. If the transient fault clears, the circuit breaker will remain closed and normal operation of the power line will resume. If the fault is permanent (downed wires, tree branches lying on the wires, etc.) the autorecloser will exhaust its pre-programmed attempts to re-energize the line and remain tripped off until manually commanded to try again. Ninety percent of faults on overhead power lines are transient and can be cleared by autoreclosing, resulting in increased reliability of supply.

Repeated manual closings into a permanent fault stress the circuit components, but this troubleshooting method is frequently employed by technicians.

If the fault cannot be cleared by automated or manual closing into the fault, the next option is to send a troubleshooter into the field to identify where the problem/fault is located. If the troubleshooter can fix the problem upon arrival he will. If additional crews are required, the troubleshooter notifies the Operations Center dispatcher to send the appropriate crew (tree crew, underground crew, substation crew, etc.). When this situation exists, outage duration usually exceeds the 2 hour tolerance level of most customers. Service restoration is confirmed at the Operations Center via SCADA, through the automated distribution system, or by contacting customers. Currently, no automated system notification of power restoration exists throughout the distribution system.

Additional devices may provide information on the location of a fault. So-called Fault Circuit Indicators (FCIs) have been used to identify when they have experienced a fault. FCIs are stand-alone devices and require visual inspection to determine their status via driving by the FCI location and looking for a color coded or blinking lighted indicator.

SUMMARY OF THE INVENTION

Disclosed is a power line takeoff clamp assembly that includes communication electronics and sensors that are powered by current flowing in an electrical power distribution line to which the takeoff clamp assembly can be coupled.

More specifically, the present invention is a power line takeoff clamp assembly that includes a body including a first housing and a second housing; means for moving the first housing and the second housing apart and together; means for sensing one or more values related to an electrical current flowing in a power line disposed between the first housing and the second housing when drawn together; means for wirelessly communicating data regarding the electrical current sensed by the means for sensing; and means for converting alternating current (AC) flowing in the power line into direct current (DC) that is provided to the means for sensing and the means for wirelessly communicating data for the operation thereof, wherein the means for sensing, the means for wirelessly communicating data, and the means for converting are supported by the body.

The power line takeoff clamp assembly can further include means for clamping the power line between the first housing and second housing when said first housing and said second housing are moved together by the means for moving.

The means for moving can include: a spring disposed between the first housing and the second housing for biasing the first housing and the second housing apart; and a screw disposed between the first housing and the second housing, said screw having male threads threadedly coupled with female threads of the means for clamping, wherein: rotating the screw in a first direction causes the first housing and the second housing to separate with the assistance of the spring bias; and rotating the screw in a second, opposite direction causes the first housing and the second housing to move together against the spring bias.

The means for converting can include: a core made from a material in which magnetic flux can be established, said core having a first part in the first housing and a second part in the second housing; a wire wound about the first or second part of the core; a rectifier coupled to the wire and operative for rectifying AC induced on the wire into DC; and a capacitor for storing DC output by the rectifier.

The means for converting can further include: a regulator disposed across the capacitor and operative for regulating a voltage on the capacitor; a current limit operative for detecting the DC output by the rectifier; a thermal reduction circuit responsive to the current limit detecting DC above a predetermined threshold for avoiding DC flowing into the capacitor; a diode disposed to block current from flowing from the capacitor into the thermal reduction circuit; and a processor operative for causing the thermal reduction circuit to avoid DC flowing into the capacitor in response to the thermal reduction circuit detecting DC above the predetermined threshold.

The power line takeoff clamp assembly can further include means for guiding the power line into a space between the first housing and the second housing when said first housing and said second housing are apart.

The means for guiding can include a projection which projects outward from the body.

The projection can be part of a means for clamping the power line between the first housing and second housing when said first housing and said second housing are moved together by the means for moving.

The power line takeoff clamp assembly can further include a channel formed in at least one of the first housing and the second housing for receiving the power line when said power line is disposed between the first housing and the second housing.

The one or more values includes one or more of the following: a current induced in the wire by current flowing in the power line; a density of a magnetic flux produced in the core from current induced in the wire by current flowing in the power line; a density of a magnetic flux surrounding the power line produced by current flowing in the power line; an electric field produced by current flowing in the power line; and a temperature of the power line.

The invention is also a power line monitoring method that includes: (a) clamping a body to an electrical power distribution line; (b) by way of means for generating supported by the body clamped to the power line, generating direct current from alternating current flowing in the power line; (c) by way of means for sensing supported by the body clamped to the power line that receives direct current for the operation thereof from the means for generating, sensing one or more values related to an electrical current flowing in a power line; and (d) by way of means for wirelessly communicating supported by the body clamped to the power line that receives direct current for the operation thereof from the means for generating, wirelessly communicating data regarding the one or more sensed values.

Lastly, the invention is a power line takeoff clamp assembly that includes: means for clamping an electrical power distribution line to a body; means for generating direct current from alternating current flowing in the power line, wherein the means for generating is supported by the body clamped to the power line; means for sensing one or more values related to an electrical current flowing in the power line, wherein the means for sensing is supported by the body clamped to the power line and utilizes direct current from the means for generating for the operation thereof; and means for wirelessly communicating data regarding the one or more sensed values, wherein the means for wirelessly communicating data is supported by the body clamped to the power line and utilizes direct current from the means for generating for the operation thereof.

The means for clamping can be operative for clamping the power line between a surface thereof and a surface of the body.

The power line takeoff clamp assembly can further include means for causing sections of the body to open to receive the power line therebetween and for causing the sections of the body to close to secure the power line therebetween.

The power line takeoff clamp assembly can further include means for guiding the power line into a space defined between the body sections when open.

The means for guiding can comprise a projection outward from one of the body sections. The projection can be part of the means for clamping.

The power line takeoff clamp assembly can further include an opening defined in the body for receiving the power line, said opening defined by the sections of the body when closed.

The means for generating can include: a core made from a material where magnetic flux can be established, said core having parts that are separable for receiving the power line in an opening of the core defined when the core parts are together; a wire wound about at least one part of the core; a rectifier coupled to the wire and operative for rectifying into direct current alternating current induced on the wire by alternating current flowing in the power line disposed in the opening of the core; and a capacitor for storing direct current output by the rectifier.

The means for generating can further include: a regulator operative for regulating a voltage on the capacitor; a current limit operative for detecting the direct current output by the rectifier; a thermal reduction circuit responsive to the current limit detecting direct current above a predetermined threshold and for avoiding direct current flowing into the capacitor when the detected direct current is above the predetermined threshold; a diode disposed to block current from flowing from the capacitor into the thermal reduction circuit; and a processor operative for causing the thermal reduction circuit to avoid direct current flowing into the capacitor in response to the thermal reduction circuit detecting direct current above the predetermined threshold.

DESCRIPTION OF THE PREFERRED EMBODIMENT

The present invention will be described with reference to the accompanying figures where like reference numbers correspond to like elements.

Figure 1:
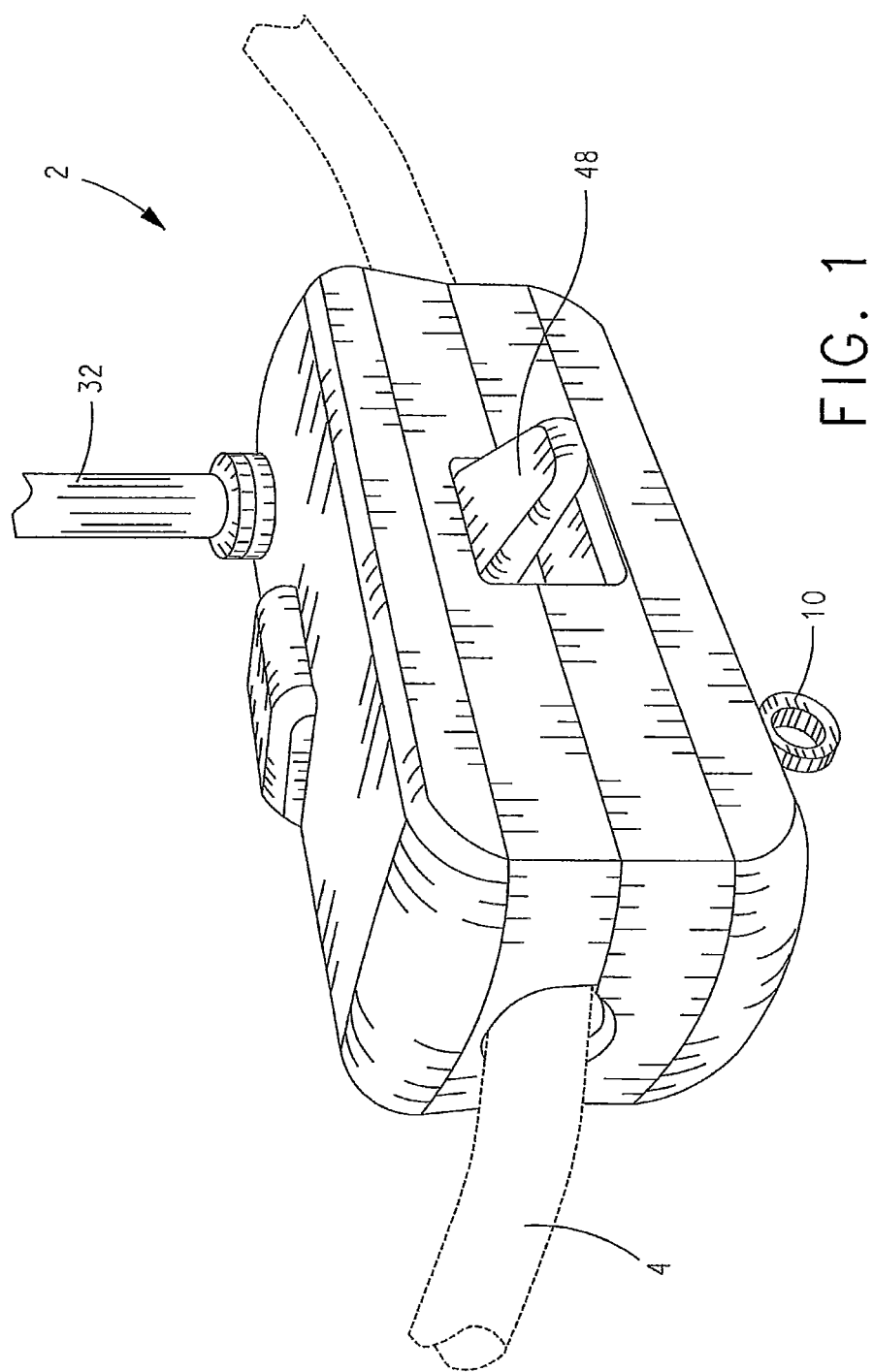
FIG. 1 is a perspective view of a power line takeoff clamp assembly in accordance with the present invention clamped about an electrical power distribution line.

With reference to FIG. 1, a power line takeoff clamp assembly 2 in accordance with the present invention is configured to be clamped about an electrical power distribution line 4 (shown in phantom).

Figure 2:
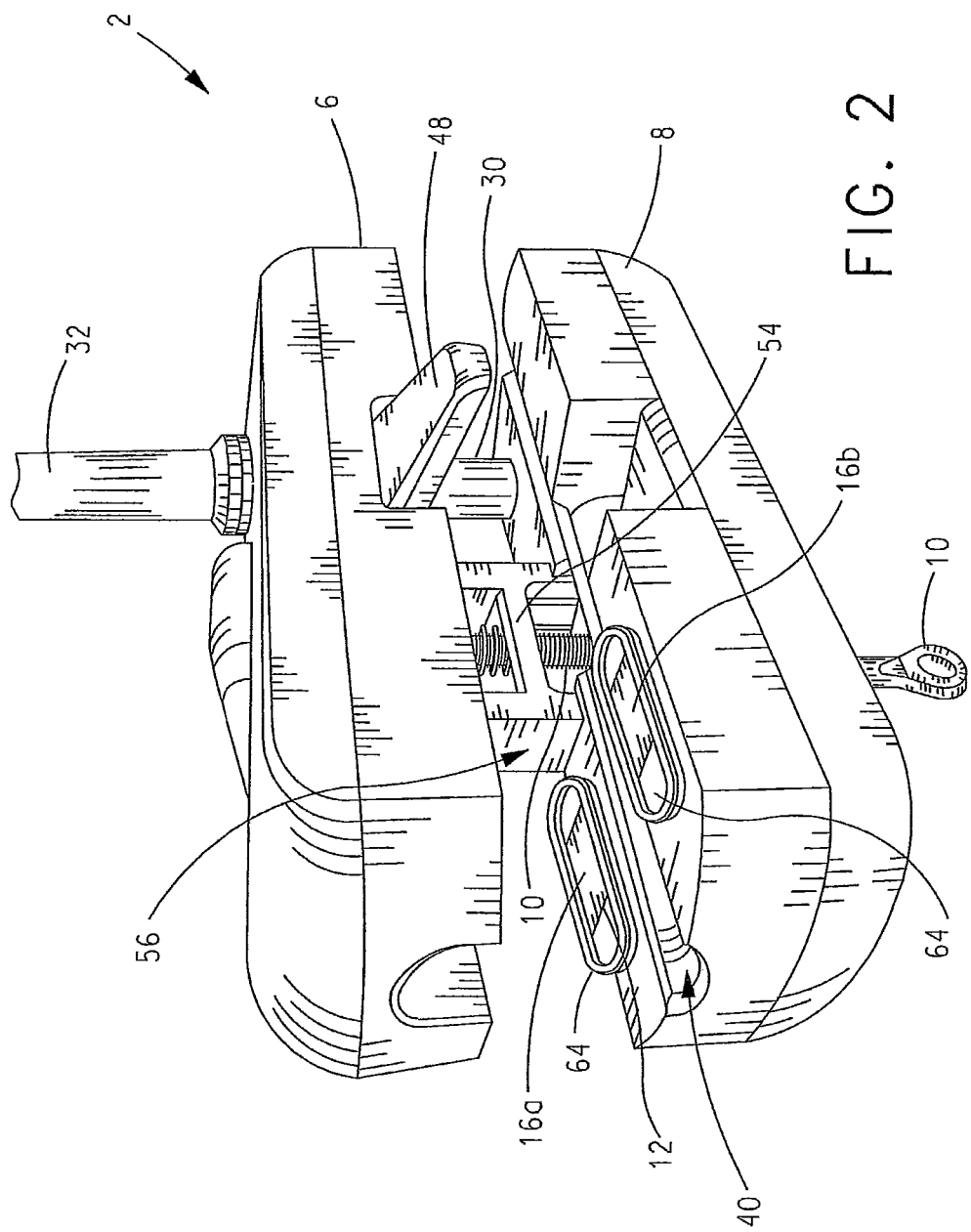
FIG. 2 is a perspective view of the power line takeoff clamp assembly shown in FIG. 1 in an open state.

With reference to FIG. 2 and with continuing reference to FIG. 1, clamp assembly 2 is comprised of a first, upper housing 6 and a second, lower housing 8 that can be separated as shown in FIG. 2 or drawn together as shown in FIG. 1 by way of a threaded screw 10 in a manner described hereinafter.

Lower housing 8 includes a first part 12 of a core 14 (shown best in FIG. 13) made from a material in which magnetic flux lines can be readily established, such as, without limitation, a transformer core. First part 12 includes a pair of faces 16(*a*) and 16(*b*). As shown best in FIGS. 13-15, first part 12 of core 14 is generally U-shaped. However, this is not to be construed as limiting the invention since it is envisioned that first part 12 can be in the form of a half circle or any suitable and/or desirable shape that facilitates the use of core 14 in the manner described hereinafter.

Figure 3:
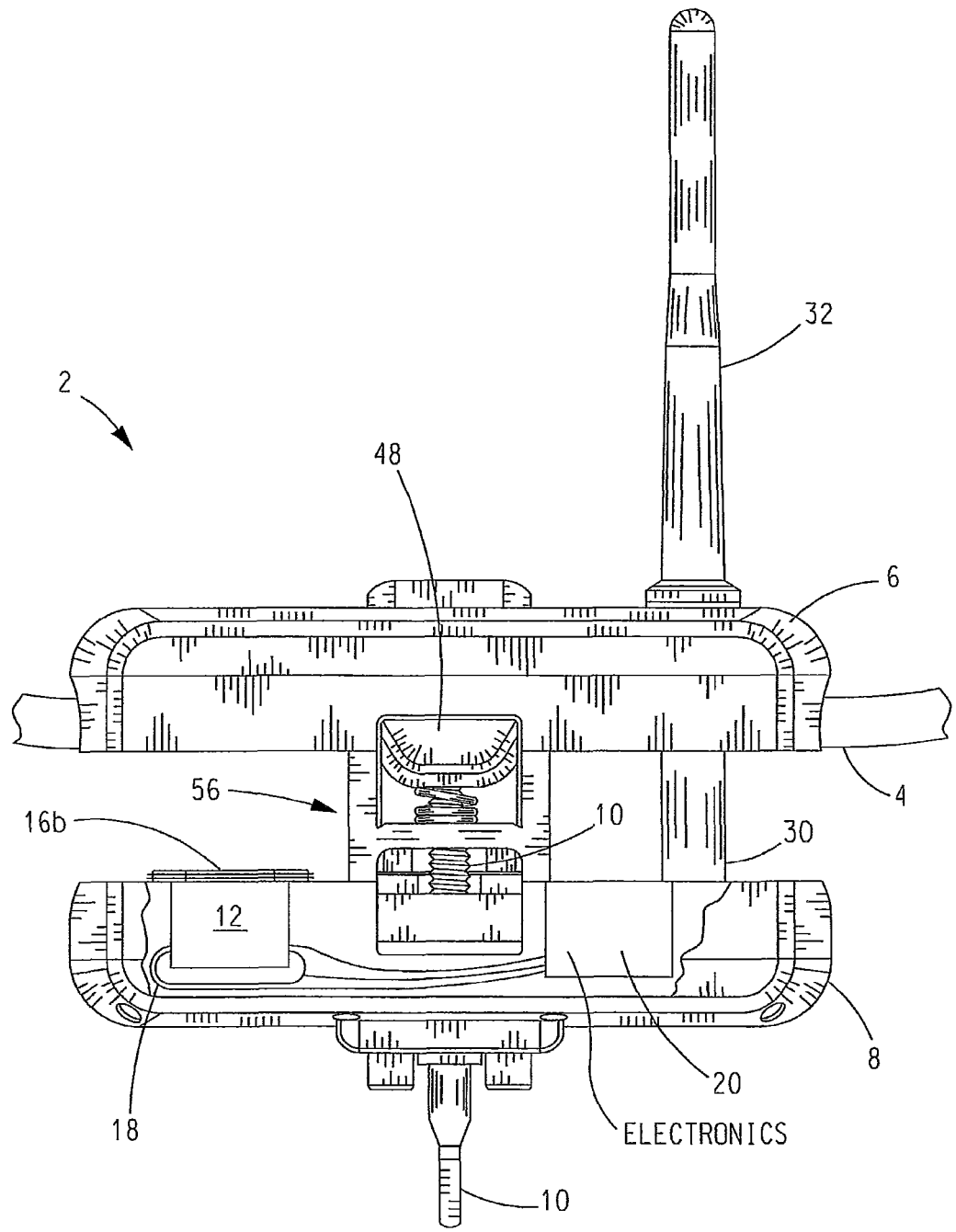
FIG. 3 is a front view of the power line takeoff clamp assembly of FIG. 1 in the open state.

With reference to FIG. 3 and with continuing reference to FIGS. 1 and 2, first part 12 of core 14 includes therearound a plurality of windings of a wire 18. The ends of the windings of wire 18 are coupled to electronics 20 which comprise a power takeoff (PTO) 22 (shown schematically in FIG. 16) and a power line sense and communications module 24 (shown schematically in FIG. 17).

Power line sense and communications module 24 includes a radio transceiver 26 which is coupled to an antenna 28 (shown best in FIGS. 6-8) which is secured at its base to lower housing 8 and which projects through a sleeve 30, upper housing 6 and an antenna cover 32 in the manner described hereinafter with reference to FIGS. 6-8.

Figure 4:
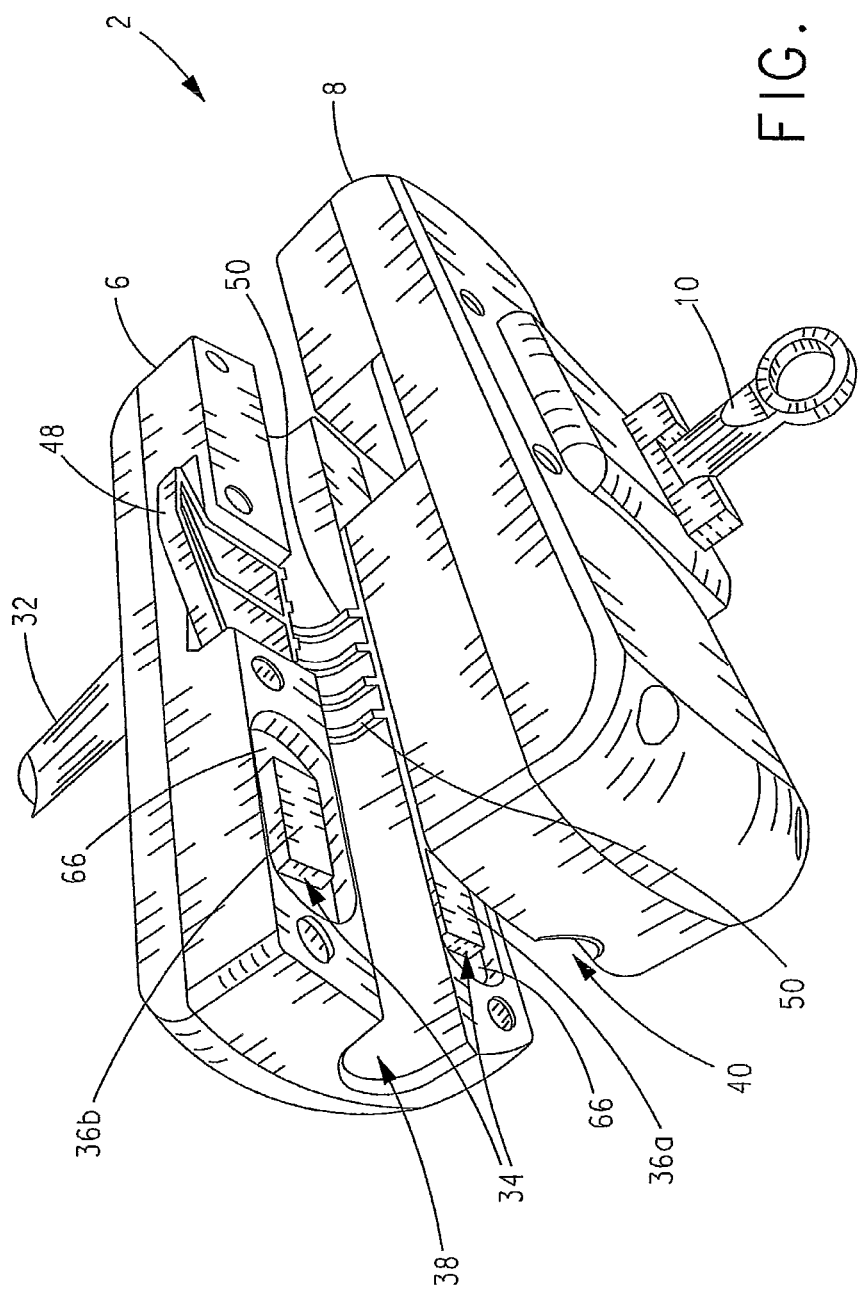
FIG. 4 is another perspective view of the power line takeoff clamp assembly of FIG. 1 in the open state.
Figure 13:
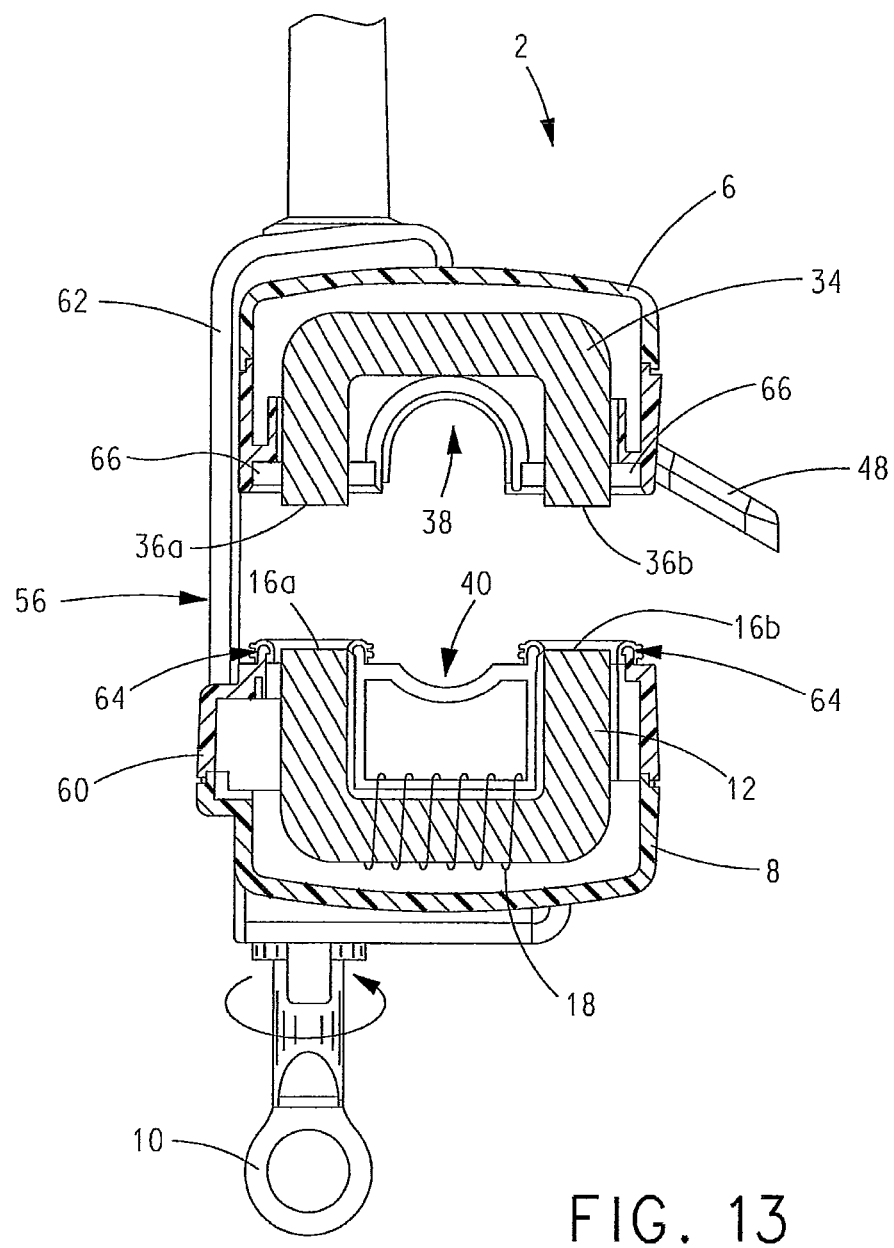
FIGS. 13-15 are open, partially closed, and fully closed sectional views of the power line takeoff clamp assembly of FIG. 1 taken along lines C-C in FIG. 5.
Figure 14:
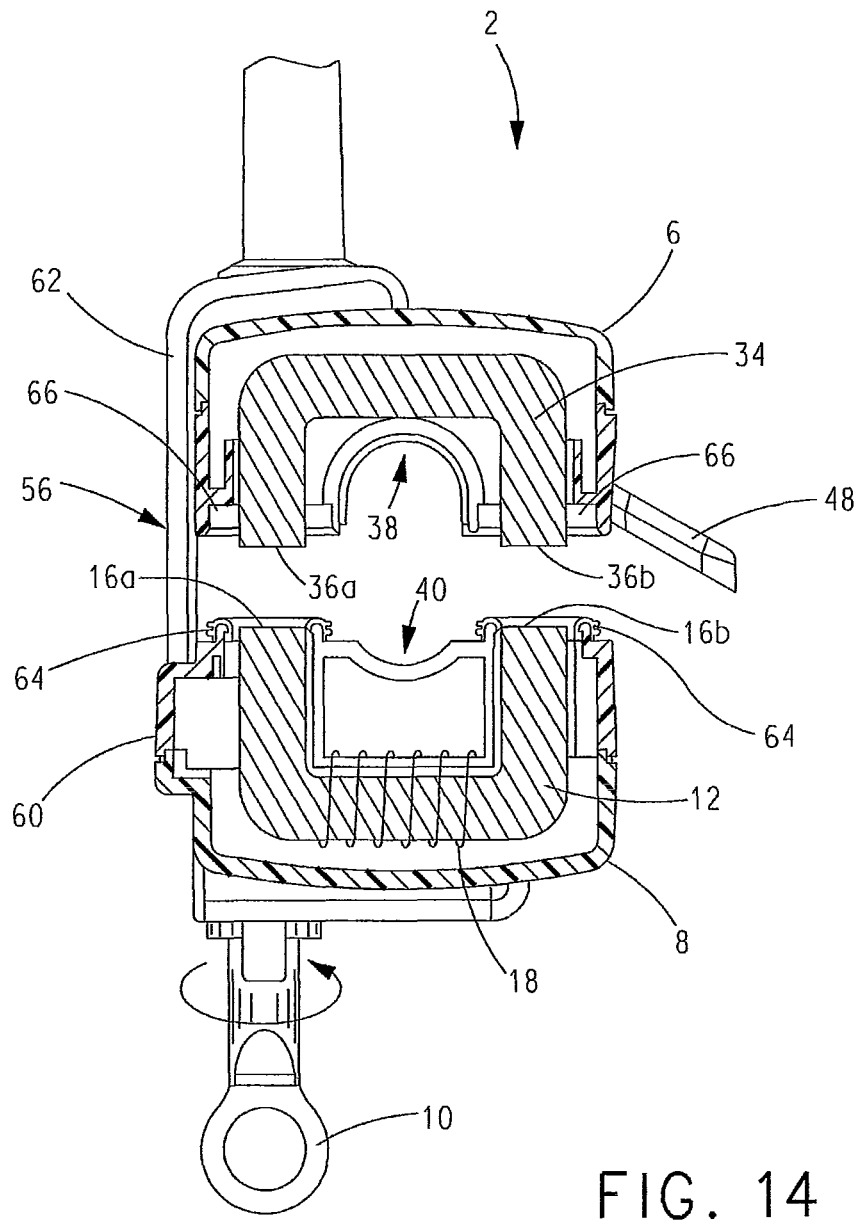
Figure 15:
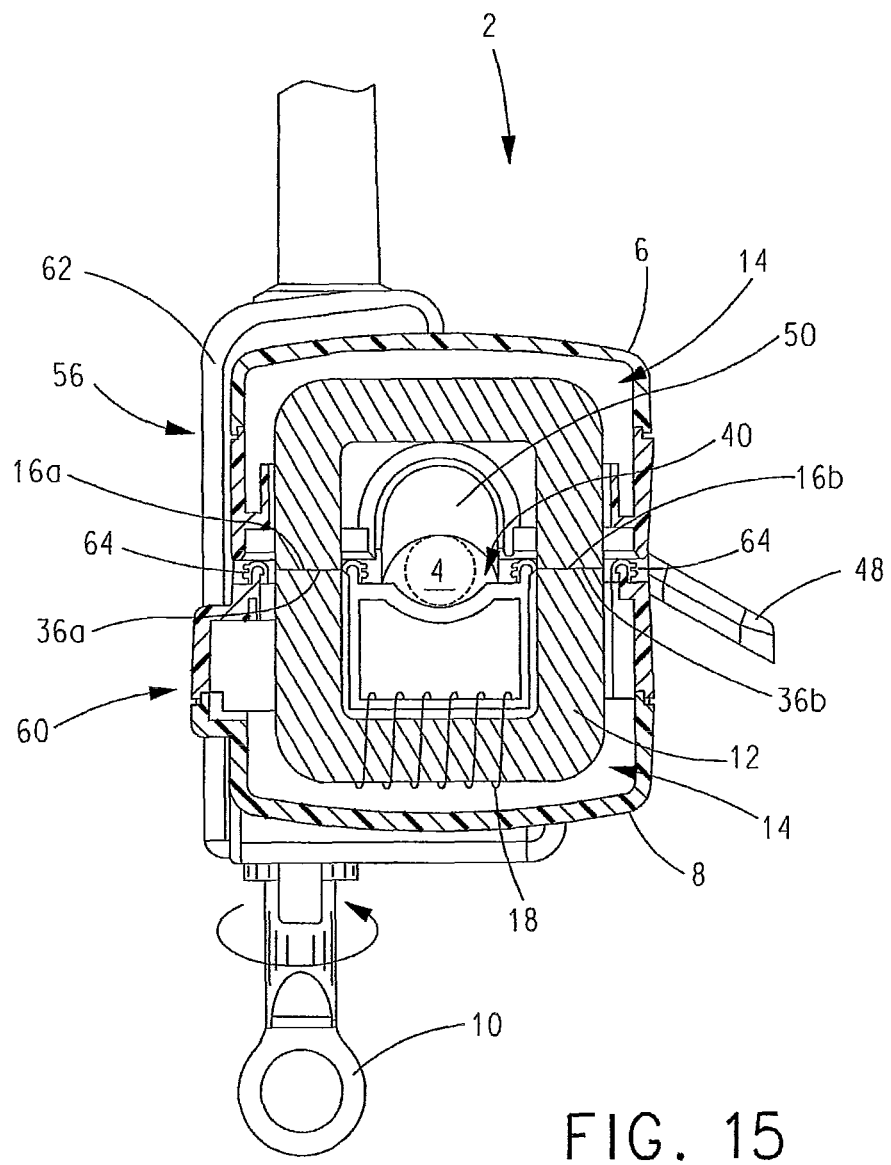

With reference to FIG. 4 and with continuing reference to FIGS. 1-3, upper housing 6 houses a second part 34 of core 14 (shown best in FIG. 13). Second part 34 of core 14 includes faces 36(*a*) and 36(*b*) which can move into contact or close proximity to faces 16(*a*) and 16(*b*), respectively, of first part 12 when upper housing 6 and lower housing 8 are moved together as shown in FIG. 15. As shown in FIGS. 13-15, second part 34 of core 14 is desirably U-shaped. However, this is not to be construed as limiting the invention since second part 34 of core 14 can be the form of a half circle or any other suitable and/or desirable shape.

As shown best in FIG. 4, upper housing 6 includes a curved or arcuate channel 38 that is configured to receive power line 4 in the manner shown in FIG. 3. Lower housing 8 includes a curved or arcuate channel 40 that cooperates with channel 38 and a clamping assembly 42, shown best in FIGS. 9-12, for clamping power line 4 when upper housing 6 and lower housing 8 are moved together in the manner described hereinafter.

Figure 5:
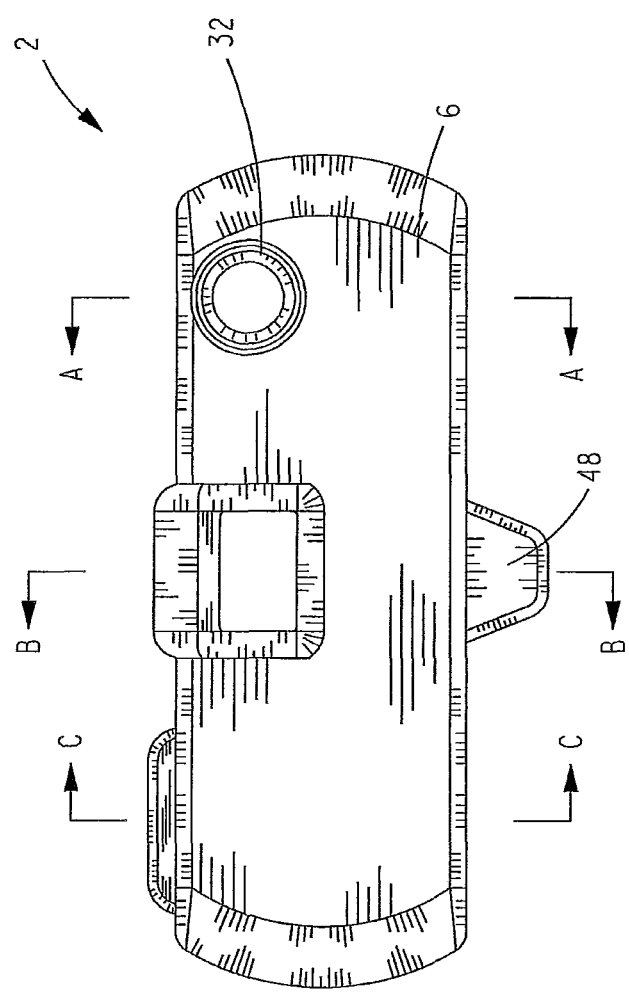
FIG. 5 is a top plan view of the power line takeoff clamp assembly of FIG. 1.

With reference to FIG. 5 and with continuing reference to FIGS. 1-4, the closing of upper housing 6 and lower housing 8 together will now be described with reference to the cross-sections shown in FIGS. 6-8 which are taken along section A-A in FIG. 5.

Figure 6:
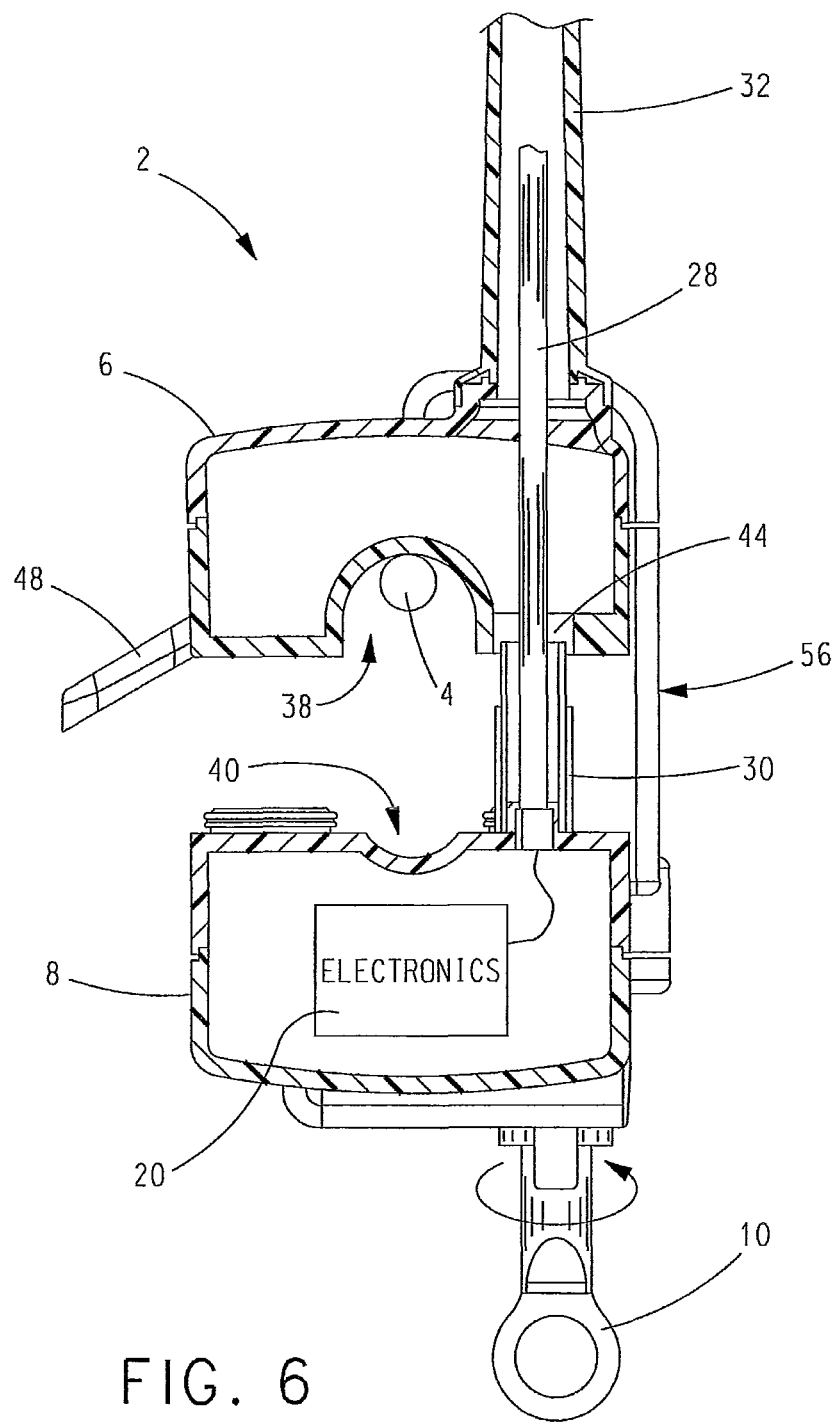
FIGS. 6-8 are open, partially closed, and fully closed sectional views of the power line takeoff clamp assembly of FIG. 1 taken along lines A-A in FIG. 5.

With upper housing 6 and lower housing 8 in the fully open position shown in FIG. 6, antenna 28 extends through sleeve 30 and into antenna cover 32 where the distal end of antenna 28 is disposed intermediate the connection of antenna cover 32 to upper housing 6 and the end of antenna cover 32 opposite upper housing 6.

Figure 7:
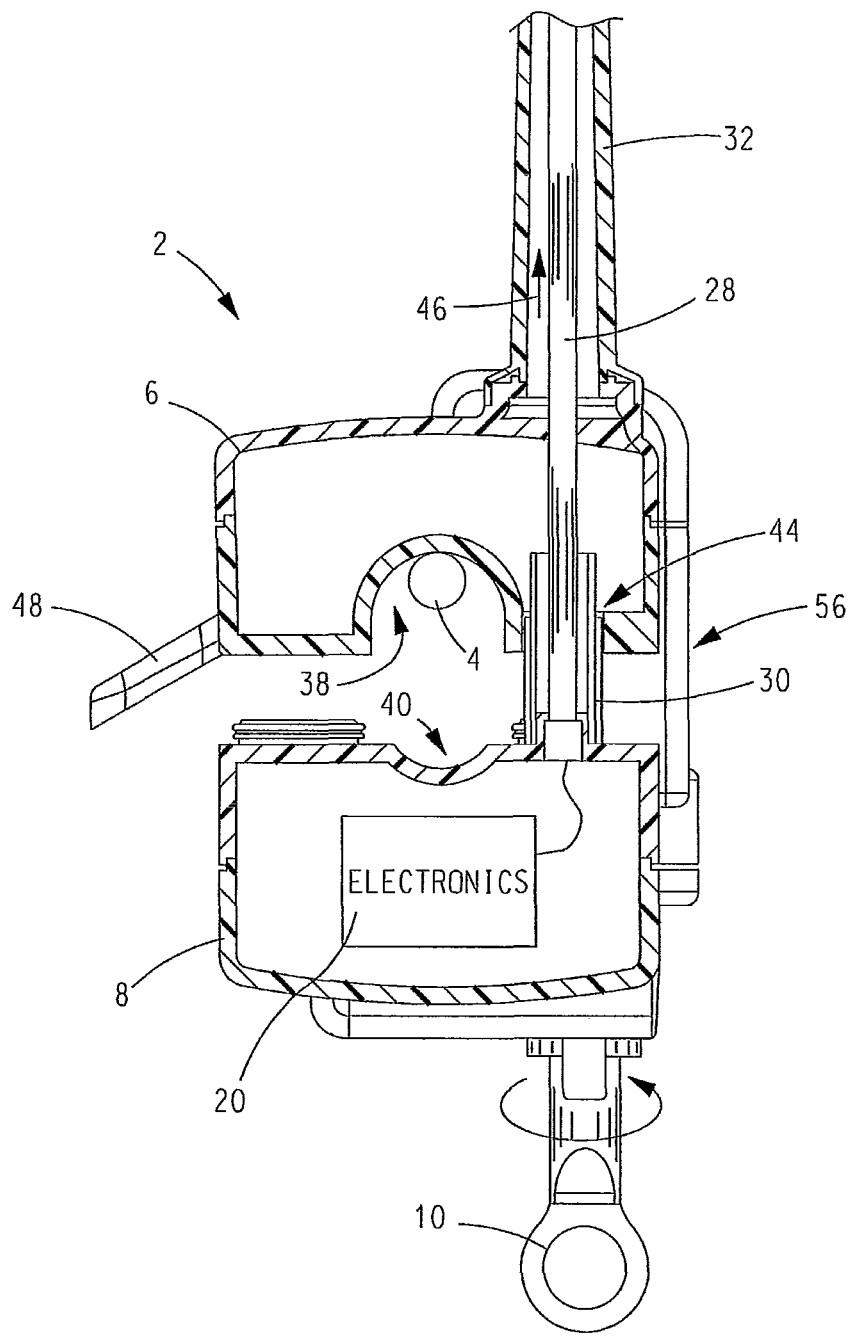

With reference to FIG. 7 and with continuing reference to FIGS. 1-6, in response to moving upper housing 6 and lower housing 8 together, the end of sleeve 30 opposite lower housing 8 moves into upper housing 6 via an opening 44 therein. At the same time, the end of antenna 28 opposite lower housing 8 moves further into antenna cover 32 in the direction shown by arrow 46 in FIG. 7.

Figure 8:
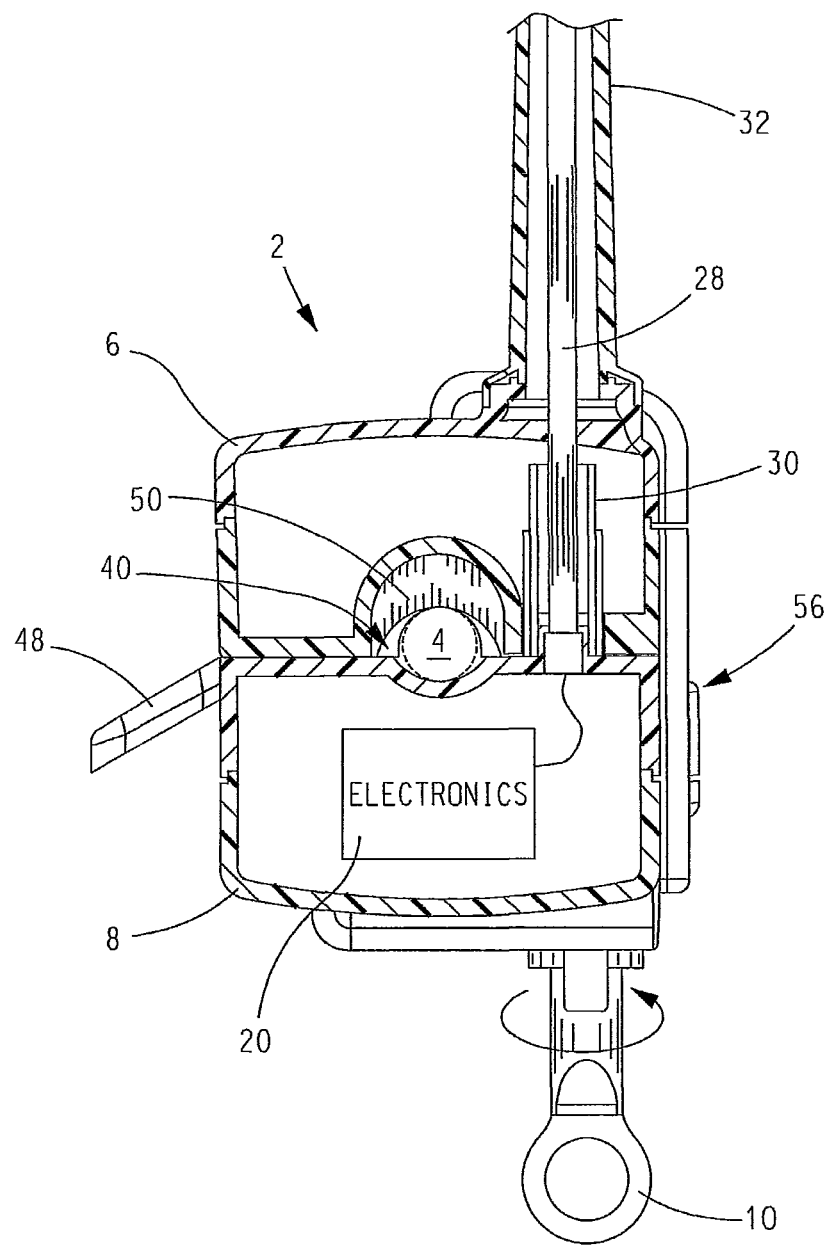

With reference to FIG. 8, when upper housing 6 and lower housing 8 are fully moved together or closed, sleeve 30 is received within upper housing 6 and antenna 28 projects to its fullest extent into antenna cover 32 which acts as a barrier to the elements but permits the transmission and receipt of RF energy via antenna 28.

With ongoing reference to FIG. 8 and with reference back to FIG. 4, clamping assembly 42 includes a so-called "duckbill" (or projection) 48 and one or more curved ribs 50 which, when upper housing 6 and lower housing 8 are in the fully closed position, press power line 4 into contact with channel 40 of lower housing 8 thereby clamping power line 4 between rib(s) 50 and channel 40 of lower housing 8. The action of clamping assembly 42 to clamp power line 4 in this manner will now be described with reference to FIGS. 9-12 which are cross-sections taken along lines B-B in FIG. 5.

Figure 9:
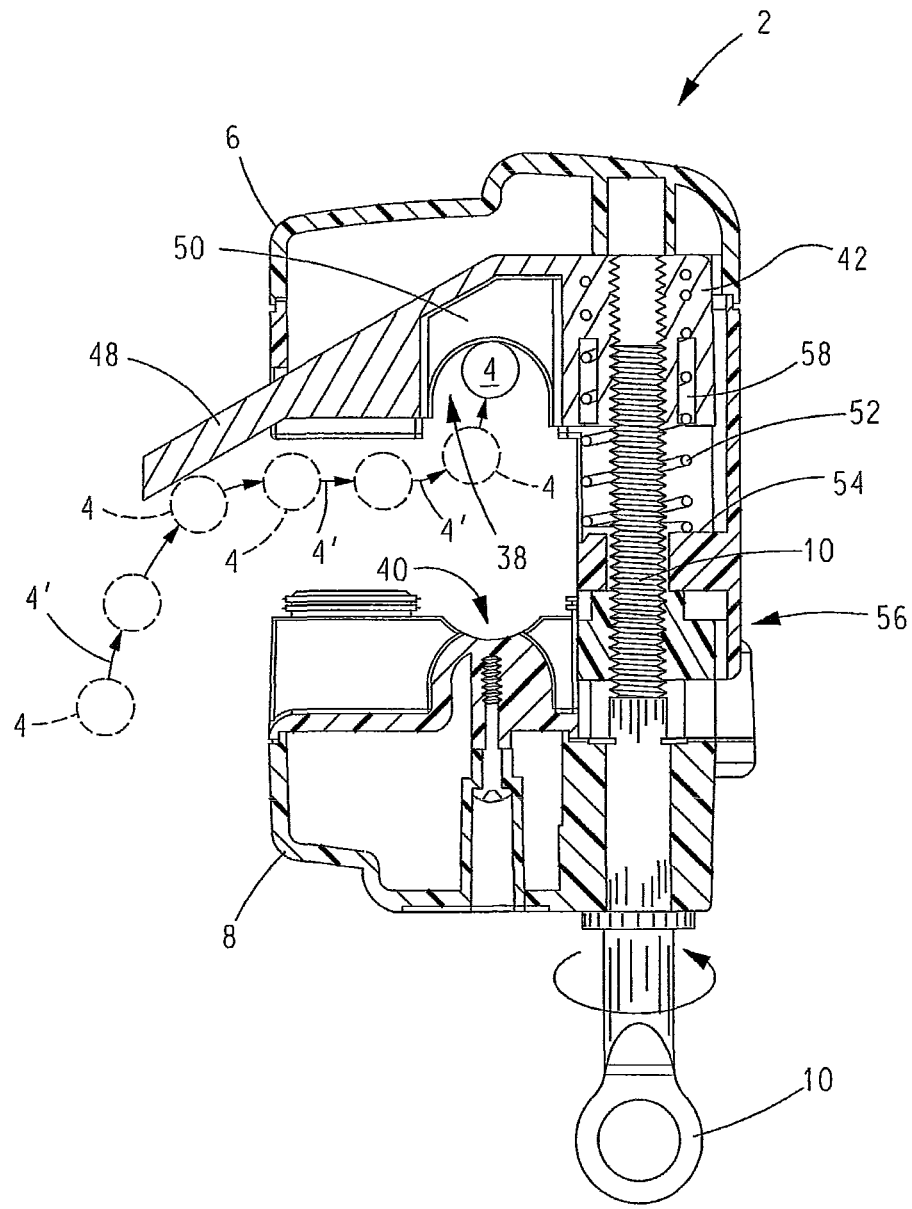
FIGS. 9-11 are open, partially closed, and fully closed sectional views of the power line takeoff clamp assembly of FIG. 1 taken along lines B-B in FIG. 5.

With reference to FIGS. 9-12, clamping assembly 42 includes duckbill 48 which facilitates the introduction of overhead power line 4 into channel 38 (as shown by the phantom power lines 4 and arrows 4' in FIG. 9) when mounting clamp assembly 42 to the power line 4 when upper housing 6 and lower housing 8 are in the open position shown in FIG. 9.

The operation of clamp assembly 42 clamping power line 4 will now be described.

As shown in FIG. 9, a coil spring 52 surrounds the threaded portion of threaded screw 10 and extends between a shoulder 54 of a guide assembly 56 that is operative for maintaining the alignment of upper housing 6 and lower housing 8, especially the alignment of threaded screw 10 and the female threads of clamp assembly 42. As shown best in FIG. 10, the lower end of spring 52 rests against shoulder 54 while the upper end of spring 52 is received in a circular slot 58 of clamp assembly 42. The threaded end of screw 10 is mated with the female threads disposed in clamp assembly 42 coaxial with circular slot 58. Clamp assembly 42 and guide assembly 56 are configured whereupon rotation of clamp assembly 42 relative to guide assembly 56 is avoided during rotation of screw 10 in the clockwise or counterclockwise direction.

At a suitable time after power line 4 is received in channel 38, a rotational force is applied about the longitudinal axis of screw 10 whereupon the threaded engagement of the male threads of screw 10 and the female threads of clamp assembly 42 cause clamp assembly 42 to be drawn toward lower housing 8 against the bias of spring 52, which is operative for biasing upper housing 6 and lower housing 8 open in the absence of screw 10 drawing clamp assembly 42 toward lower housing 8.

Figure 10:
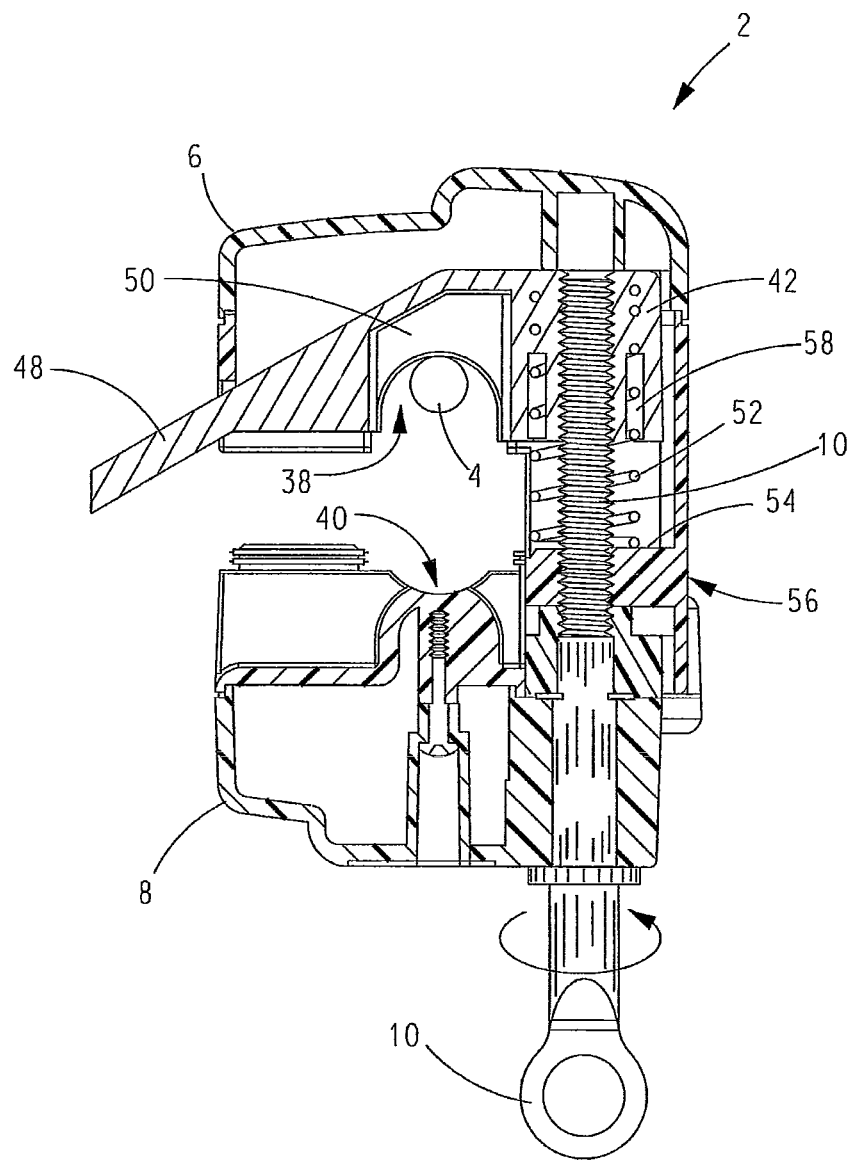
Figure 11:
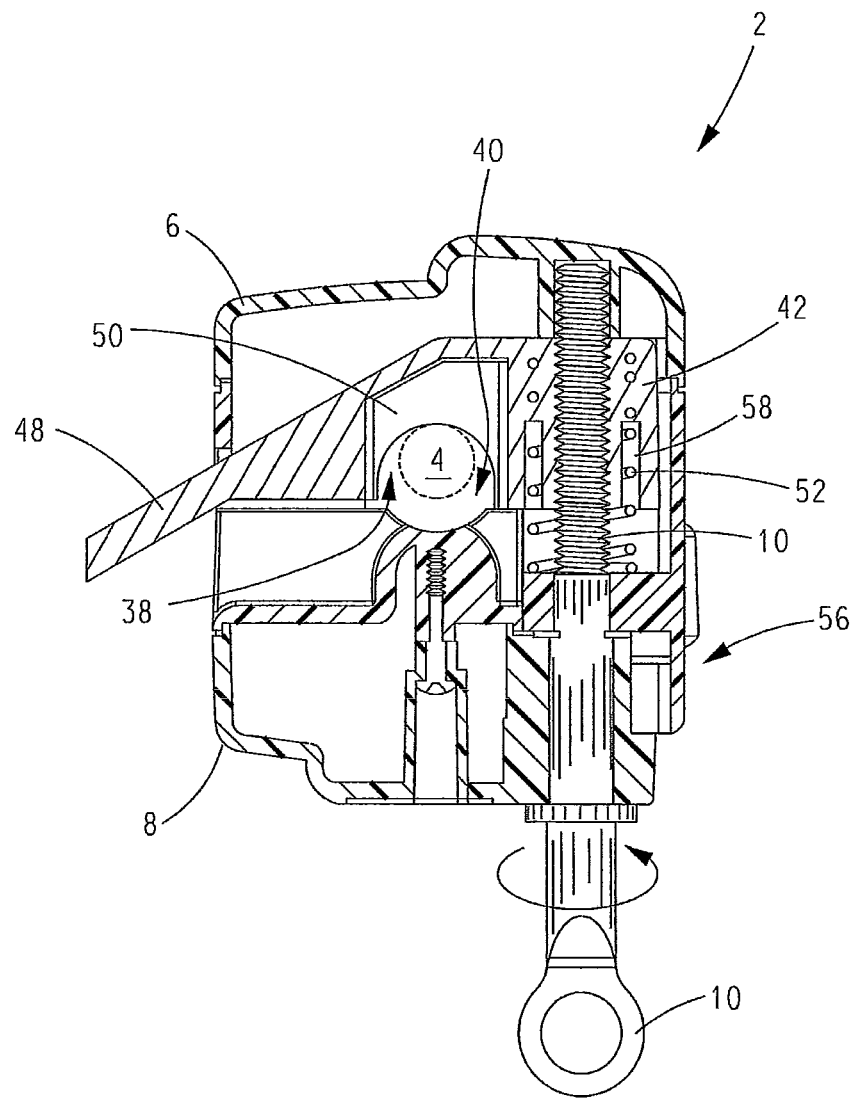
Figure 12:
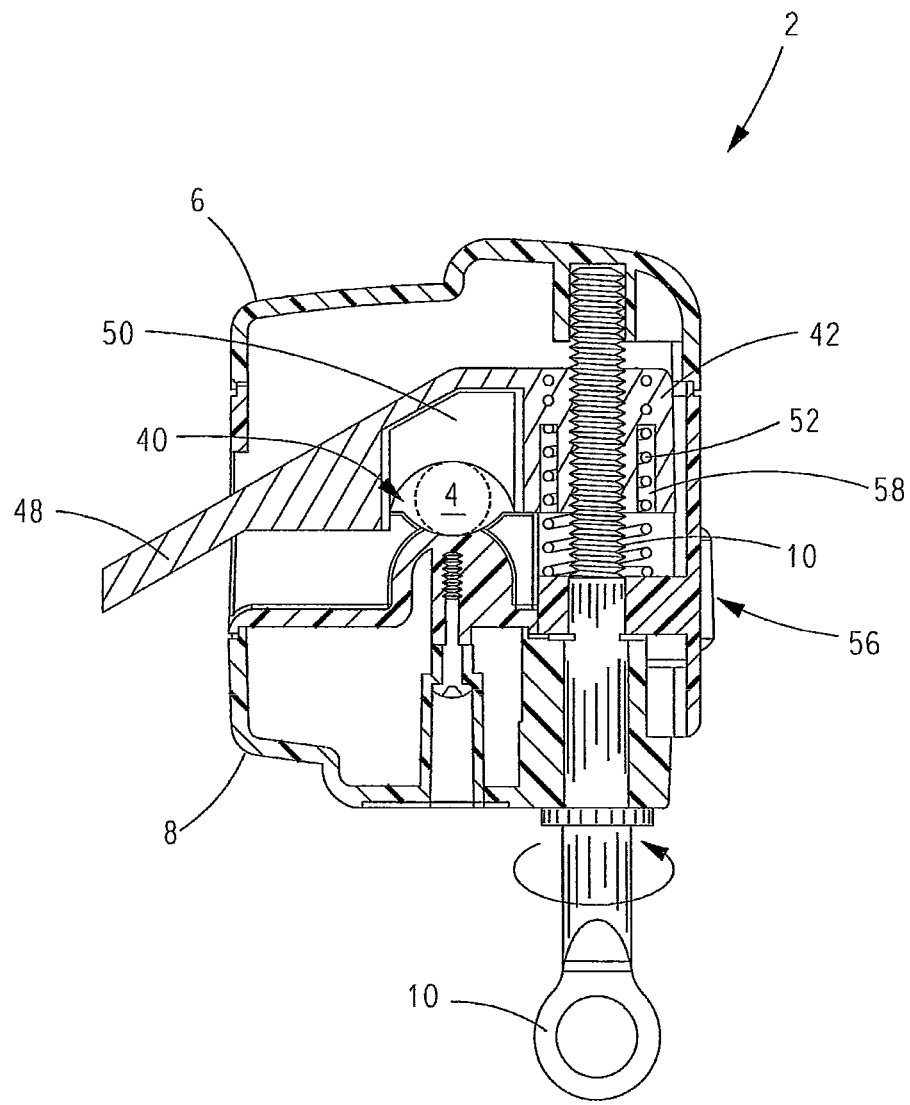
FIG. 12 is a view of the power line takeoff clamp assembly of FIG. 11 with a rib of a clamp assembly thereof moved into contact with power line 4.

As shown in sequence in FIGS. 10-12, rotating screw 10 in a first direction draws clamp assembly 42 and, hence, upper housing 6 toward lower housing 8 until upper housing 6 and lower housing 8 meet (FIG. 11) and, optionally, faces 16(*a*) and 16(*b*) of the first part 12 of core 14 contact or come into close proximity to faces 36(*a*) and 36(*b*) of second part 34 of core 14.

As shown in progression in FIGS. 11 and 12, once upper housing 6 and lower housing 8 are in contact, continued rotation of screw 10 causes clamp assembly 42 to continue to move toward lower housing 8 whereupon one or more rib(s) 50 of clamp assembly 42 move into contact with and clamp power line 4 between said rib(s) 50 and the surface of channel 40.

Comparing FIGS. 11 and 12, it can be seen that clamp assembly 42 continues to travel toward lower housing 8 after upper housing 6 and lower housing 8 are in contact. Moreover, comparing FIGS. 10 and 12, it can be seen that the edge of rib(s) 50 that actually contact and actually clamp power line 4 in FIG. 12 reside above the surface of channel 38 prior to causing clamp assembly 42 to clamp power line 4 between the surface of channel 40 and the lower edge(s) of rib(s) 50 in the clamp position. Thus, the ends of rib(s) 50 that actually clamp power line 4 continue to move below the level of the surface of channel 38 to effect clamping of power line 4 in FIG. 12.

FIGS. 13-15 show a cross-section of clamp assembly 2 from the fully opened to the fully closed position taken along lines C-C in FIG. 5.

Guide assembly 56 includes a slotted stationary member 60 affixed to lower housing 8 and a slidable member 62 attached to upper housing 6 and slidable within a slot (not shown) of stationary member 60.

As shown in FIGS. 13-15, in response to rotating screw 10 about its longitudinal axis, upper housing 6 and lower housing 8 move together until upper housing 6 and lower housing 8 touch and, optionally, faces 16(*a*) and 16(*b*) of first part 12 of core 14 contact or move into close proximity to faces 36(*a*) and 36(*b*) of second part 34 of core 14.

As shown in FIG. 15, upon rotating screw 10 to a sufficient extent, the end(s) of rib(s) 50 move into contact with power line 4 thereby clamping power line 4 to the surface of channel 40.

Surrounding each face 16(*a*) and 16(*b*) of the first part 12 of core 14 is a sealing means 64 that cooperates with a recess 66 in upper housing 6 surrounding each face 36(*a*) and 36(*b*) of the second part 34 of core 14, as shown best in FIG. 4. As shown best in FIG. 15, when upper housing 6 and lower housing 8 are clamped together, each sealing means 64 forms with the corresponding recess 66 an environmental seal about the faces 16 and 36 of the first and second parts 12 and 34, respectively, of core 14.

It is to be appreciated that the closing of upper housing 6 and lower housing 8 together described in connection with FIGS. 6-8, 9-12, and 13-15 described above can be reversed whereupon upper housing 6 and lower housing 8 can be moved to the fully opened position of clamp assembly 2 simply by rotating screw 10 in a direction opposite to the direction utilized to close upper housing 6 and lower housing 8 together. When opening upper housing 6 and lower housing 8 to the fully opened position, spring 52 acts to bias upper housing 6 and lower housing 8 to the open position, thus, aiding in the opening of upper housing 6 and lower housing 8 to the fully opened position.

Figure 16:
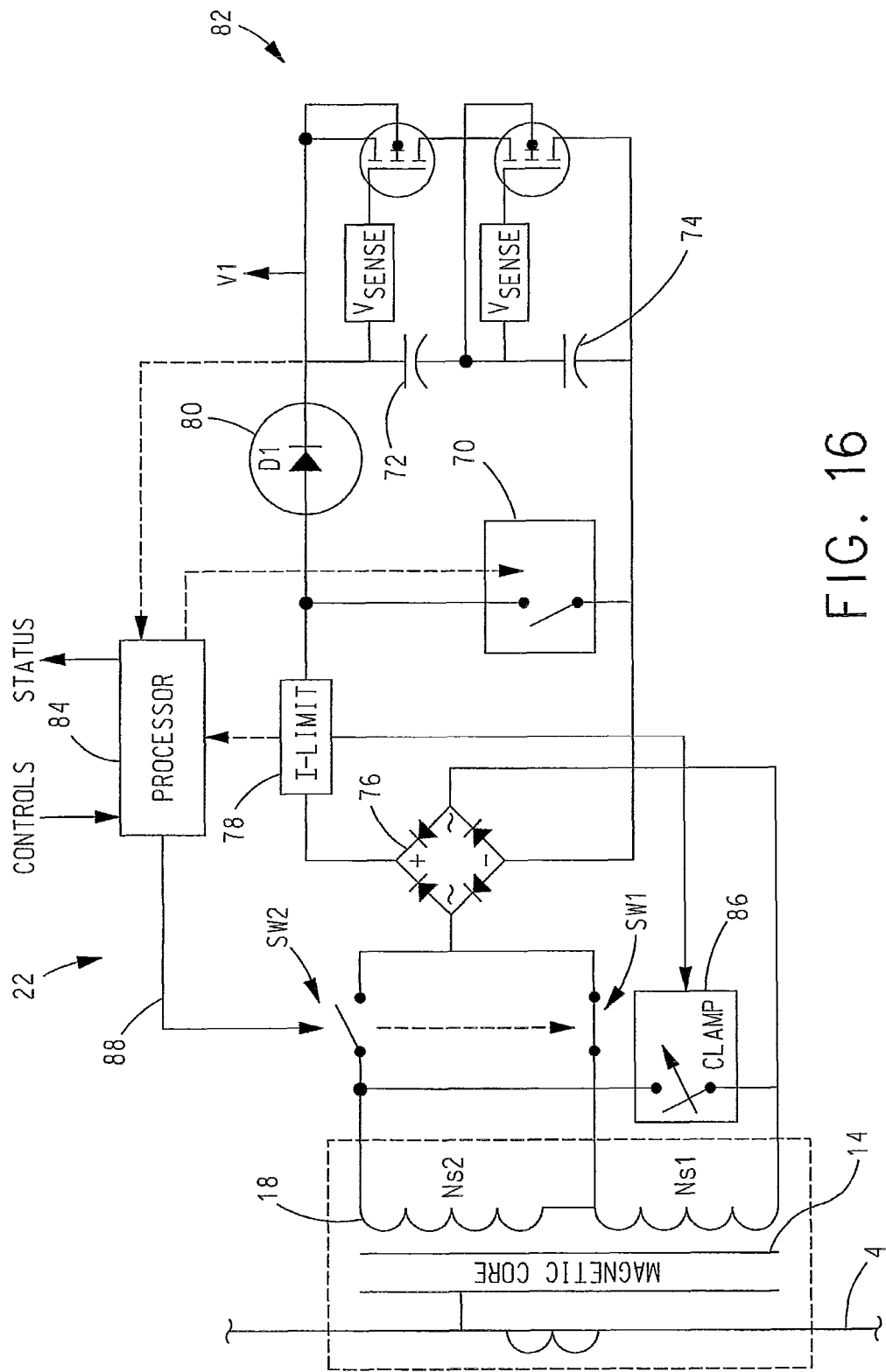
FIG. 16 is an electrical schematic of power line takeoff (PTO) electronics of the power line takeoff clamp assembly of FIG. 3.
Figure 17:
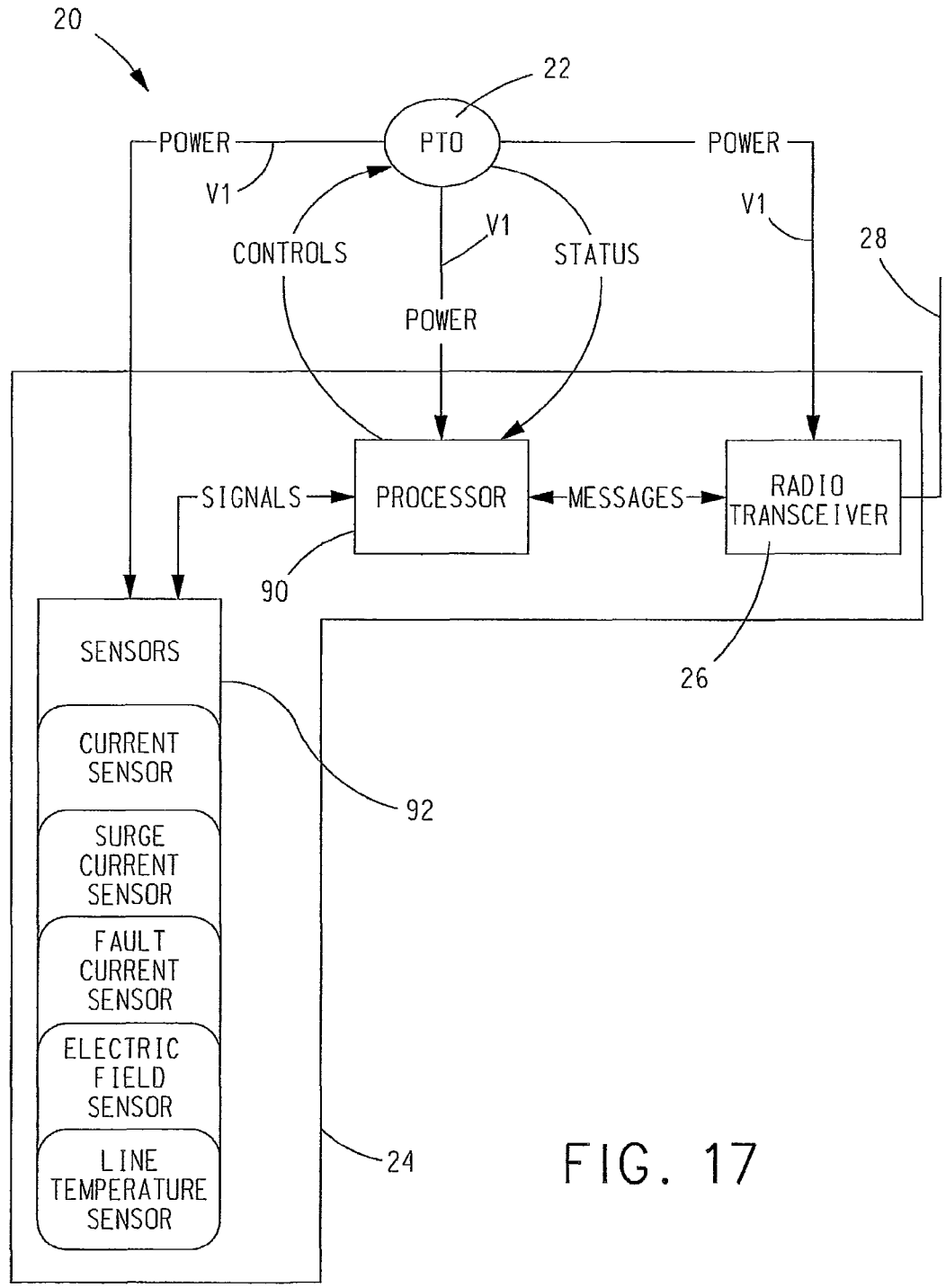
FIG. 17 is a block diagram of the electronics of the power line takeoff clamp assembly shown in FIG. 3 including the PTO of FIG. 16 and a power line sensing communication module.

With reference to FIGS. 16 and 17, as discussed above in connection with FIG. 3, lower housing 6 houses electronics 20 comprising a power takeoff (PTO) 22 and a power line sense and communications module 24. PTO 22 is designed to obtain and manage electrical power from power line 4. Power is obtained via an inductive coupler and managed via electronic circuits and processor control described hereinafter. PTO 22 allows apparatus, such as power line sense and communications module 24, to be directly powered from line 4 regardless of line voltage, thereby eliminating the need for a step-down transformer.

The inductive coupler is formed from power line 4, core 14 and the windings of wire 18 which are wound as secondary windings Ns1 and Ns2. In the non-limiting embodiment described above, core 14 is formed from two individual U-shaped core pieces 12 and 34 that mechanically separate to allow core 14 to be clamped around power line 4. When the core pieces are closed to form core 14, power line 4 forms a single turn primary Np in combination with core 14. Secondary windings Ns1 and Ns2 each include a number of turns that establish a suitable current ratio.

The inductive coupler operates as a current transformer where the current flowing in power line 4 is transformed to secondary windings Ns1 and Ns2 by a ratio set by the turns ratio thereof. As discussed above, PTO 22 includes secondary windings Ns1 and Ns2 which allow the current ratio to be selected based upon power line current levels and the power needs of the apparatus that PTO 22 powers. PTO 22 also includes a thermal reduction circuit 70 that avoids excessive power dissipation by PTO 22. Power is stored in so-called super capacitors 72 and 74 so that backup power and/or low-duty-cycle high-current applications can be supported.

As discussed above, the inductive coupler operates as a current transformer with the windings Ns1 and Ns2 determining the current ratio relative to the current flowing in power line 4. When PTO 22 is first energized, a switch SW1 will be closed and a switch SW2 will be open. This is performed automatically when PTO 22 is de-energized to allow a low ratio to be selected for fast charge times of super capacitors 72 and 74 via a full-wave rectifier 76, a current limit 78, and a diode 80. While there is no functional limit on the number of secondary windings Ns1 and Ns2 for switches SW1 and SW2 that could be implemented, in practice, the number of windings Ns are typically limited by physical size.

With current flowing in power line 4, a magnetic field is set up in core 14 which induces a voltage in secondary windings Ns1 and Ns2. With switch SW1 closed and switch SW2 open, AC current will flow in winding Ns1 through switch SW1, through full-wave rectifier 76 which converts the AC current into DC current. DC current output by rectifier 76 flows through current limit 78, through diode 80, and into capacitors 72 and 74 and/or through a shunt regulator 82 and then returns to full-wave rectifier 76. As would be appreciated by one skilled in the art, the magnitude of the current that flows through switch SW1 is inversely proportional to the number of turns in Ns1.

Desirably, DC current will flow into super capacitors 72 and 74 which will charge them and produce a voltage V1. When voltage V1 reaches a desired level, shunt regulator 82 will shunt current away from super capacitors 72 and 74 halting the charge thus maintaining a constant voltage V1. Shunt regulator 82 includes for each capacitor 72 and 74 sensing circuitry Vsense that measures the voltage across the corresponding super capacitor and a switch, e.g., a MOSFET transistor, responsive to the output of Vsense for regulating the voltage across the corresponding super capacitor. Shunt regulator 82 prevents overcharging of super capacitors 72 and 74, which typically have a limited voltage range.

Voltage V1 provides electrical power to other modules comprising electronics 20, such as, without limitation, power line sense and communications module 24. Voltage V1 also provides a limited amount of electrical power to a processor 84 of PTO 22 and other supporting circuitry of PTO 22. In response to the apparatus, e.g., module 24, drawing power from super capacitors 72 and 74, shunt regulator 82 will regulate the voltage level of voltage V1 by bypassing or allowing super capacitors 72 and 74 to charge. Excess power not consumed by the apparatus is thermally dissipated by shunt regulator 82. In operation, processor 84 monitors the current flowing through current limit 78 and causes thermal reduction circuit 70 to activate when the current flowing through current limit 78 is above a predetermining level. Thermal reduction circuit 70 includes a switch that closes to avoid current flowing through diode 80 and into capacitors 72 and 74, and shunt regulator 82 thus significantly lowering the operating voltage of the secondary side of Ns1 or Ns2 thus lowering thermal dissipation. Diode 80 blocks current from back feeding from super capacitors 72 and 74 into thermal reduction circuit 70.

Processor 84 monitors voltage V1 and also obtains a current reading from current limit circuit 78. Based on these two readings, processor 84 determines when thermal reduction circuit 70 should be activated and for how long. When thermal reduction circuit 70 is operated, any apparatus power will be drawn from super capacitors 72 and 74 and the voltage will begin to drop since current is not being supplied to super capacitors 72 and 74. Desirably, the signal to thermal reduction circuit 70 will be a pulse width modulated signal to keep voltage V1 within predetermined bounds.

Current limit circuit 78 is designed to provide a current reading to processor 84 and to fire a clamp circuit 86 if the current exceeds a design threshold. The purpose is to prevent damage to the components of PTO 22 during high current conditions. When clamp 86 fires, the secondary current produced from the series combination of Ns1 and Ns2 would set the ratio to the highest range (minimum secondary current) and lowers the voltage significantly thus setting the thermal dissipation to a minimum. Current limit circuit 78 operates on a per cycle basis so that as soon as the surge current condition is over, PTO 22 reverts back to normal operation. A benefit of operating current limit circuit 78 on a per cycle basis is that a portion of the current is allowed to continue to charge super capacitors 72 and 74. All of this is desirably performed automatically without the intervention of processor 84 thus providing high reliability and fast response time. This is important for the case when PTO 22 is initially installed on a high current power line. Voltage V1 is initially zero which means that processor 84 is not functioning. As noted above, a low ratio, e.g., Ns1, is initially selected which, on high current power lines, can easily exceed current limit circuit 78 causing clamp circuit 86 to fire thereby connecting Ns1 and Ns2 in series. If super capacitors 72 and 74 are not given a charge each cycle, PTO 22 would be stuck in this state. As it is, super capacitors 72 and 74 charge quickly which raises voltage V1 and allows processor 84 to power up. Processor 84 makes a current reading from current limit 78 and, if appropriate, causes switch SW2 to close and switch SW1 to open thereby causing the series combination of Ns1 and Ns2 to supply electrical power to the remaining components of PTO 22.

Processor 84 determines the ratio to select, e.g., Ns1 or the series combination of Ns1 and Ns2, based on the present level of voltage V1 and the current flowing through diode 80 as determined via current limit 78. If a higher ratio is desired in order to lower the secondary current, switch S2 is closed and switch S1 is open whereupon the secondary ratio would then be the combination of Ns1+Ns2. In no event are switches SW1 and SW2 closed at the same time. To ensure this, the signal on line 88 is implemented as a single binary signal controlling both switch SW1 and SW2 with inverse logic. The ability to switch to a higher ratio secondary winding (Ns1+Ns2) and the use of thermal reduction circuit 70, enhances the accuracy of current reading by current limit 78 by lowering the flux swing in core 14.

Super capacitors 72 and 74, shunt regulator 82, current limit 78 and thermal reduction circuit 70 perform exactly the same whether Ns1 alone or the series combination of Ns1 and Ns2 are supplying power thereto. Typically, processor 84 will switch to the series combination of Ns1 and Ns2 before enabling thermal reduction circuit 70 since operation at the series combination of Ns1 and Ns2 will typically lower thermal dissipation significantly.

With reference to FIG. 17, PTO 22 can provide voltage V1 to any suitable and/or desirable apparatus, including power line sense and communications module 24 shown in block diagram in FIG. 17. Module 24 can include a processor 90 coupled to one or more sensors 92 for detecting conditions on power line 4 either directly or indirectly. For example, sensors 92 can include a current sensor, a surge current sensor, a fault current sensor, an electric field sensor, and a line temperature sensor. The current sensor can be operative for providing to processor 90 an electrical value that represents the secondary current that flows in winding Ns1 which is proportional to the current flowing in power line 4 as a function of the turns ratio of Ns1. The current sensor can be in the form of a resistor that processor 90 converts the voltage thereacross from an analog signal to a digital signal for processing thereby.

The surge current sensor and fault current sensor can each be a Hall device which measures the magnetic field surrounding power line 4. As discussed above, when upper housing 6 and lower housing 8 are closed, core 14 surrounds power line 4 and concentrates the magnetic field. This increase in flux density minimizes the errors introduced as the distance between power line 4 and the Hall devices vary due to line diameter variations. The surge current Hall sensor produces a voltage proportional to the flux density in core 14. This voltage is converted to a digital signal via suitable analog-to-digital converter circuitry of processor 90.

Fault current sensing can be performed by another Hall device which measures a magnetic field surrounding power line 4. This Hall device positioned at a known distance from power line 4 is utilized for fault currents, e.g., exceeding 1000 amps. The fault current Hall device produces a voltage proportional to the flux density surrounding power line 4 that is converted into a corresponding digital signal by analog-to-digital converter circuitry of processor 90.

The electric field sensor measures the electric field emanating from the power line via parallel plates disposed on opposite sides of power line 4. The voltage impressed on these parallel plates can be converted into a digital signal by analog-to-digital converter circuitry of processor 90.

Lastly, the temperature sensor measures the temperature of power line 4. It does this by being in close proximity to power line 4. The temperature sensor produces a voltage proportional to the temperature which is converted into a digital signal by analog-to-digital converter circuitry of processor 90.

Desirably, module 24 includes all of the foregoing sensors. However, this is not to be construed as limiting the invention since it is envisioned that module 24 can include any one or combination of the sensors described above.

Processor 90 can communicate the results obtained from each sensor via radio transceiver 26 and antenna 28. The combination of processor 90, radio transceiver 26, and antenna 28 can also be utilized to receive data regarding sensor readings from other clamp assemblies in radio communication range and to forward said data readings to yet other clamp assemblies. Thus, two or more clamp assemblies 2 of the type described above can be utilized to form a network for communicating the status and operating characteristics of power lines 4 to which they are attached. The use of a plurality of clamp assemblies of the type described above in a network is disclosed in U.S. patent application Ser. No. 12/341,300, filed on Dec. 22, 2008, which is incorporated herein by reference.

The invention has been described with reference to the preferred embodiment. Obvious modifications and alterations will occur to those of ordinary skill in the art upon reading and understanding the preceding detailed description. It is intended that the invention be construed as including all such modifications and alterations insofar as they come within the scope of the appended claims or the equivalents thereof.

The invention claimed is:

1. A power line takeoff clamp assembly comprising:
    a body including a first housing and a second housing;
    means for moving the first housing and the second housing apart, where the power line is movable from a position that is not between the first housing and the second housing to a position that is between the first housing and the second housing, and together, where the power line positioned between the first housing and the second housing is clamped between the first housing and the second housing;
    means for sensing one or more values related to an electrical current flowing in a power line disposed between the first housing and the second housing when together;
    means for wirelessly communicating data regarding the electrical current sensed by the means for sensing; and
    means for converting alternating current (AC) flowing in the power line into direct current (DC) that is provided to the means for sensing and the means for wirelessly communicating data for the operation thereof, wherein the means for sensing, the means for wirelessly communicating data, and the means for converting are supported by the body.

2. The power line takeoff clamp assembly of claim 1, further including means for clamping the power line between the first housing and second housing when said first housing and said second housing are moved together by the means for moving.

3. The power line takeoff clamp assembly of claim 2, wherein the means for moving includes:
    a spring disposed between the first housing and the second housing for biasing the first housing and the second housing apart; and
    a screw disposed between the first housing and the second housing, said screw having male threads threadedly coupled with female threads of the means for clamping, wherein:
        rotating the screw in a first direction causes the first housing and the second housing to separate with the assistance of the spring bias; and
        rotating the screw in a second, opposite direction causes the first housing and the second housing to move together against the spring bias.

4. The power line takeoff clamp assembly of claim 1, further including means for guiding the power line into a space between the first housing and the second housing when said first housing and said second housing are apart.

5. The power line takeoff clamp assembly of claim 4, wherein the means for guiding includes a projection which projects outward from the body.

6. The power line takeoff clamp assembly of claim 5, wherein the projection is part of a means for clamping the power line between the first housing and second housing when said first housing and said second housing are moved together by the means for moving.

7. The power line takeoff clamp assembly of claim 1, further including a channel formed in at least one of the first housing and the second housing for receiving the power line when said power line is disposed between the first housing and the second housing.

\* \* \* \* \*